(12) United States Patent
Nagasaku et al.

(10) Patent No.: US 6,833,806 B2
(45) Date of Patent: Dec. 21, 2004

(54) RADAR SENSOR

(75) Inventors: Toshiyuki Nagasaku, Kokubunji (JP); Hiroshi Kondoh, Fuchu (JP); Hiroshi Shinoda, Tokyo (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 10/781,914

(22) Filed: Feb. 20, 2004

(65) Prior Publication Data

US 2004/0160357 A1 Aug. 19, 2004

Related U.S. Application Data

(63) Continuation of application No. 10/227,358, filed on Aug. 26, 2002, now Pat. No. 6,717,544.

(30) Foreign Application Priority Data

Apr. 26, 2002 (JP) ........................................ 2002-125910

(51) Int. Cl.[7] ............................ G01S 7/00; G01S 13/00; G01S 13/93
(52) U.S. Cl. ............................ 342/27; 342/70; 342/175
(58) Field of Search ............................. 342/5, 11, 27, 342/28, 70–72, 82–104, 175, 195

(56) References Cited

U.S. PATENT DOCUMENTS

| | | |
|---|---|---|
| 5,864,061 A | 1/1999 | Dilz, Jr. |
| 6,028,560 A | 2/2000 | Pfizenmaier et al. |
| 6,037,894 A | 3/2000 | Pfizenmaier et al. |
| 6,130,640 A | 10/2000 | Uematsu et al. |
| 6,496,138 B1 | 12/2002 | Honma |
| 6,501,417 B1 | 12/2002 | Bowlds |

FOREIGN PATENT DOCUMENTS

| | | | | |
|---|---|---|---|---|
| DE | 41 27 892 A1 | 2/1991 | | |
| EP | 0 884 799 A2 | 3/1998 | | |
| JP | 08292270 A | * 11/1996 | ............ | G01V/3/12 |
| JP | 11-004118 | 6/1997 | | |
| JP | 2000-059140 | 8/1998 | | |
| JP | 2000-209026 | 1/1999 | | |
| JP | 2003315438 A | * 11/2003 | ............ | G01S/7/03 |
| WO | WO 00/65691 | 4/2000 | | |

OTHER PUBLICATIONS

Sanjay Raman, N. Scott Barker, and Gabriel M. Rebeiz, "A W–Band Dielectric–Lens–Based Integrated Monopulse Radar Receiver", IEEE Transactions on Microwave Theory and Techniques, vol. 46, No. 12, Dec. 1998, pp. 2308–2315.

* cited by examiner

*Primary Examiner*—Bernarr E. Gregory
(74) *Attorney, Agent, or Firm*—Reed Smith LLP; Standley P. Fisher, Esq.; Juan Carlos A. Marquez, Esq.

(57) ABSTRACT

The invention intends to provide a sensor module suitable for miniaturization and reduction in costs, in the radar sensor that uses a millimeter or sub-millimeter wave signal of which frequency is more than 20 GHz. To accomplish this problem, the radar sensor is integrated into a one chip MMIC, in which an active circuit including an oscillator and a mixer is formed with an antenna on one semiconductor substrate. Further, the MMIC is sealed with a resin package. A dielectric lens is formed on the resin package over the antenna to attain a desired beamwidth. Thereby, the lens and the resin package can integrally be formed by a metal mold, thus reducing the cost.

20 Claims, 11 Drawing Sheets

40 IF   39

RADAR SENSOR

This application is a Continuation of non-provisional U.S. application Ser. No. 10/227,358 filed Aug. 26, 2002 now U.S. Pat. No. 6,717,544. Priority is claimed based on U.S. application Ser. No. 10/227,358 filed Aug. 26, 2002, which claims the priority of Japanese application 2002-125910 filed on Apr. 26, 2002.

BACKGROUND OF THE INVENTION

1. Field of the Invention

The present invention relates to a radar sensor, more in detail to a receiving unit of radar equipment that radiates a transmission signal and receives a reflection signal from an object having reflected the transmission signal to thereby detect the presence and position of the object, and the moving speed of the object or the vehicle on which the radar is mounted, and so forth, specifically to a radar sensor that uses a millimeter wave or sub-millimeter wave signal more than 20 Ghz to the transmission signal.

2. Description of the Related Art

Radar equipment has been widely used which radiates an electromagnetic wave and receives a reflection wave from an object that has reflected the electromagnetic wave to thereby detect the object, (hereunder, radar equipment is simply called radar). In recent years, a super high frequency signal such as a millimeter wave or a sub-millimeter wave is applied to this electromagnetic wave. As a typical example of the radar using this kind of millimeter wave, there is the on-vehicle radar applied to a warning system for a distance between vehicles.

In most of millimeter wave modules used to these systems, an active circuit including an oscillator and a mixer and so forth is mounted on a base plate, which is hermetically sealed into a conductive package in order to shield external noises. Discrete components such as diodes are used as the elements of the active circuit, however in recent years an MMIC (Monolithic Microwave Integrated Circuit) is utilized in order for miniaturization and lighter weight and so forth.

However, hermetically sealing by the conductive package requires placing the antenna outside the conductive package, which leads to a problem of expanding the size of the module. Further, the active circuit inside the conductive package must be connected to the external antenna, which also gives a problem of being not suitable for cost reduction of the module. A technique to solve these problems is disclosed in Japanese Patent Laid-open No. H11-4118, for example. According to the technique as shown in FIG. 5, the active circuit 25 and the antenna 24 are mounted on one plane of the base plate 26, which is mounted on one metal base plate 21. In case of FIG. 5, the antenna 24 is formed on the base plate 26. And, a radiation window 22 from which the antenna 24 radiates electromagnetic waves is provided over the antenna 24. The radiation window 22 is formed with a nonconductive material, and is welded to the conductive package 23 for hermetical sealing. The radiation window 22 also functions as a dielectric lens that condenses the electromagnetic waves into a desired beamwidth.

In the on-vehicle radar and so forth, reduction of the production cost as well as miniaturization of the unit becomes extremely important. The foregoing conventional technique is suitable for miniaturization, but the radiation window has to be provided to the conductive package, and the radiation window and the conductive package have to be welded for sealing hermetically; thus it has a still more complicated packaging structure and more manufacturing processes. Accordingly, the conventional technique involves difficulty in achieving a millimeter wave radar sensor at a low production cost.

An object of the invention is to achieve a radar sensor that operates in the millimeter wave ranges at a low cost in a small size.

BRIEF SUMMARY OF THE INVENTION

In order to accomplish the foregoing object, in the radar sensor of the invention, an antenna and an active circuit including an oscillator coupled to the antenna and a mixer, etc., are made up into an MMIC (Monolithic Microwave Integrated Circuit), and the MMIC and the antenna are sealed with a resin package.

One preferred embodiment of the invention has a lens formed on a part of the resin package near the antenna. The lens may be formed integrally with the resin package by using the same material as that of the resin package, or it may be formed to be replaceable.

The active circuit and the antenna can be made up with plural MMIC chips and the antenna, but a necessary active circuit may be formed into one chip MMIC.

Further, the antenna may be formed on one semiconductor substrate together with the active circuit, and the antenna and the active circuit may be formed into one chip.

According to the invention, generally the resin package can be formed by a metal mold, which remarkably reduces the manufacturing cost; and being non-conductive, the resin package does not need to provide a special structure such as a radiation window over the antenna. From this point, it is suitable for reduction in costs.

Especially, in case of achieving a radar sensor that radiates a high frequency signal more than 20 GHz and receives a reflected signal from an object that reflected the high frequency signal, providing the resin package with a dielectric lens will decrease the area for a planar antenna as a microstrip patch antenna to make the radar sensor small accordingly, and also facilitate the setting of beamwidth of the radio wave from the antenna. In case of the planer antenna as a microstrip patch antenna, generally plural antenna elements synthesize powers to attain a desired beamwidth. Since the area of IC is proportional to the cost, the number of antenna elements should be small. Therefore, the radar sensor of the invention takes on a construction that attains a desired beamwidth by providing a few antenna elements (extremely, one element) and mounting a dielectric lens over the antenna.

In case of making a dielectric lens and a resin package separately and making a radar sensor by adhering these, producing the dielectric lens in plural shapes, selecting the most suitable one according to the application used, and adhering the selected one to the resin package will attain a radar sensor suitable for each application.

The relative permittivity of a material for the dielectric lens and the resin package should be about 3 to 6, from the viewpoint of lens size.

BRIEF DESCRIPTION OF SEVERAL VIEWS OF DRAWING

DETAILED DESCRIPTION OF THE INVENTION

The preferred embodiments of the invention will be described with reference to the accompanying drawings.

Figure 1:
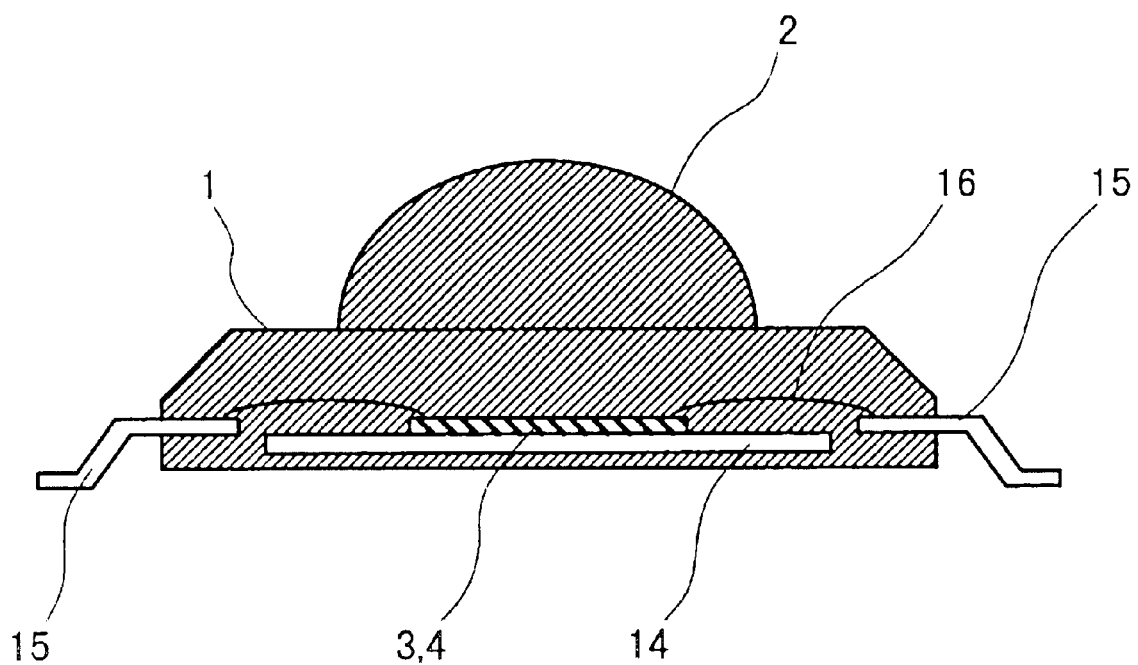
FIG. 1 is a sectional view of the first embodiment of a radar sensor according to the present invention.
Figure 2:
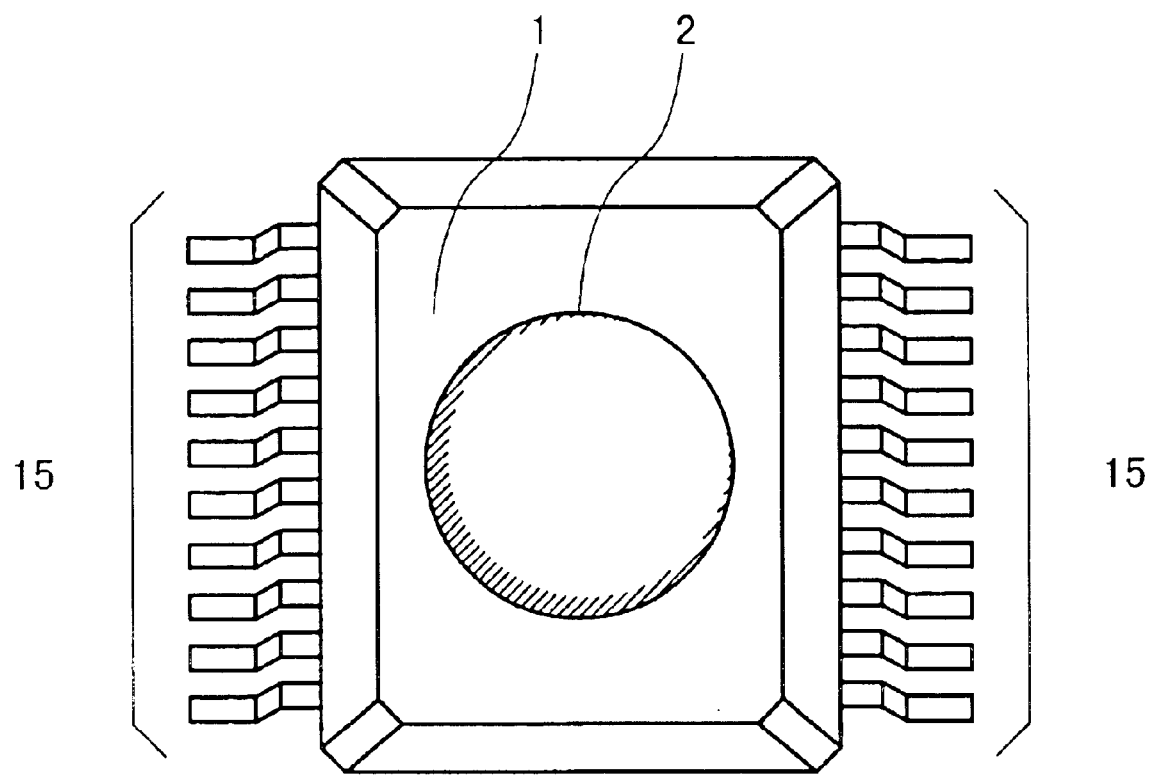
FIG. 2 is a general plan view of the first embodiment of the radar sensor according to the invention.
Figure 3:
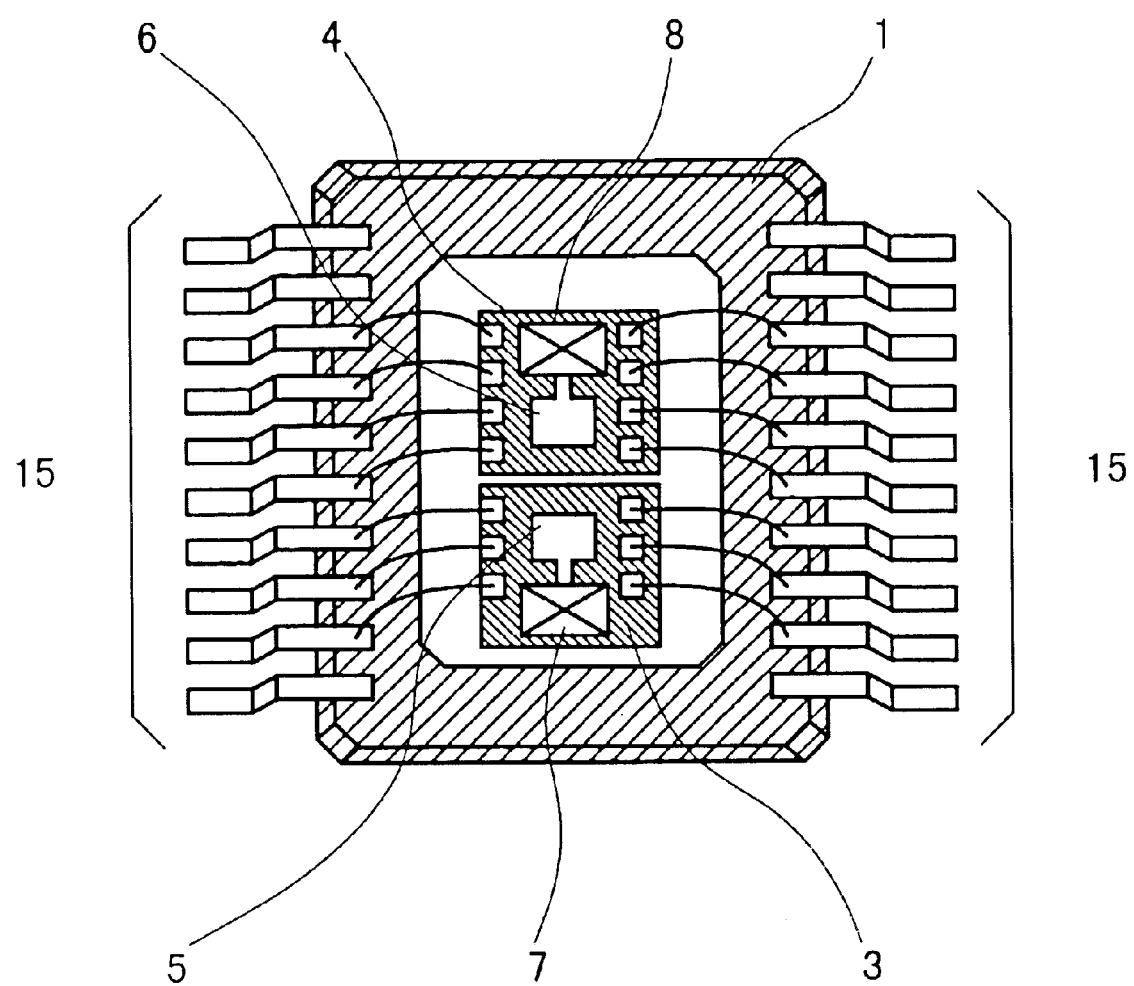
FIG. 3 is a plan view with exclusion of the upper part of the first embodiment of the radar sensor according to the invention.

FIG. 1 through FIG. 3 illustrates the first embodiment of the radar sensor according to the invention. FIG. 1 is a sectional view of the radar sensor; FIG. 2 is a general plan view of the radar sensor; and FIG. 3 is a plan view without the upper part of a package. In this embodiment, a transmission IC3 and a reception IC4 are mounted inside one resin package 1. The transmission IC3 is, as illustrated in FIG. 3, a one-chip MMIC formed on one semiconductor substrate, which includes an active circuit 7 for transmission and a transmission antenna 5. In the same manner, the reception IC4 is a one-chip MMIC formed on one semiconductor substrate, which includes an active circuit 8 for reception and a reception antenna 6. The transmission IC3 and reception IC4 are secured on a base plate 14. The IC3 and IC4 are connected to circuits outside the module through electrode pads of the MMIC and connection pins 15 placed securely on the periphery of the module and wires 16 that connect the electrode pads and the connection pins 15.

This embodiment mounts a dielectric lens 2 provided separately from the resin package 1, on the resin package 1 above a planner antenna by a microstrip patch antenna constituting the transmission antenna 5 and reception antenna 6. This embodiment uses one antenna element for each of the transmission antenna 5 and reception antenna 6, and thereby reduces the area of the chip, namely, the cost by condensing the electromagnetic waves.

Figure 4A:
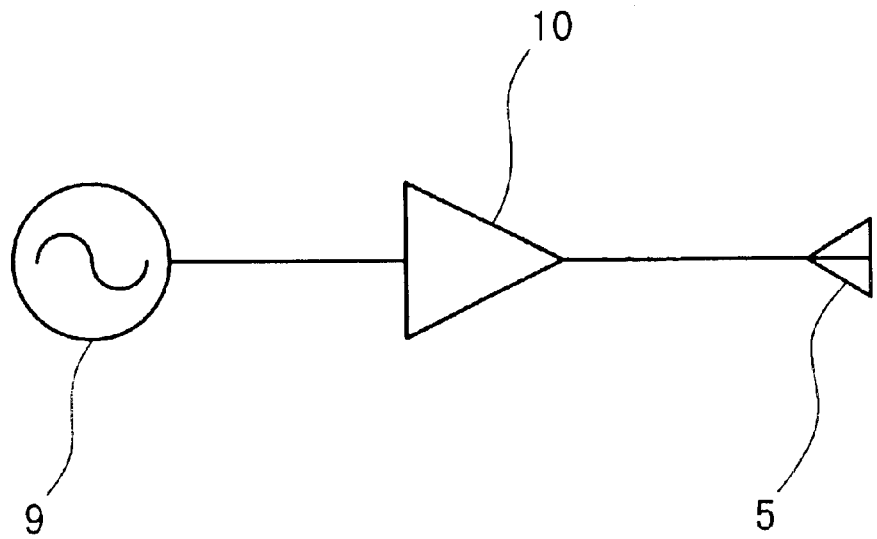
FIG. 4 is an equivalent circuit diagram of an IC of the first embodiment according to the invention.
Figure 4B:
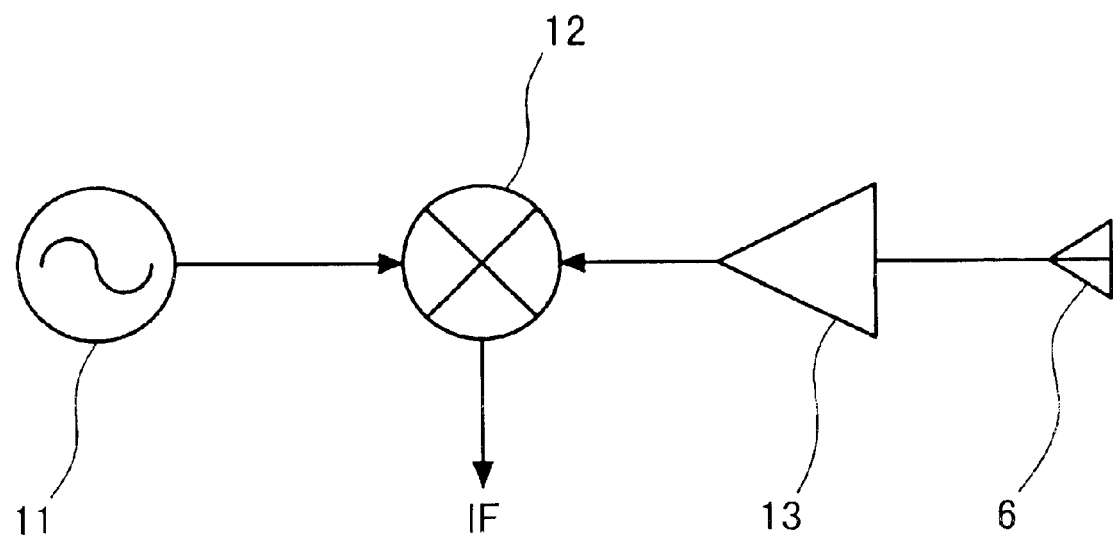
Figure 5:
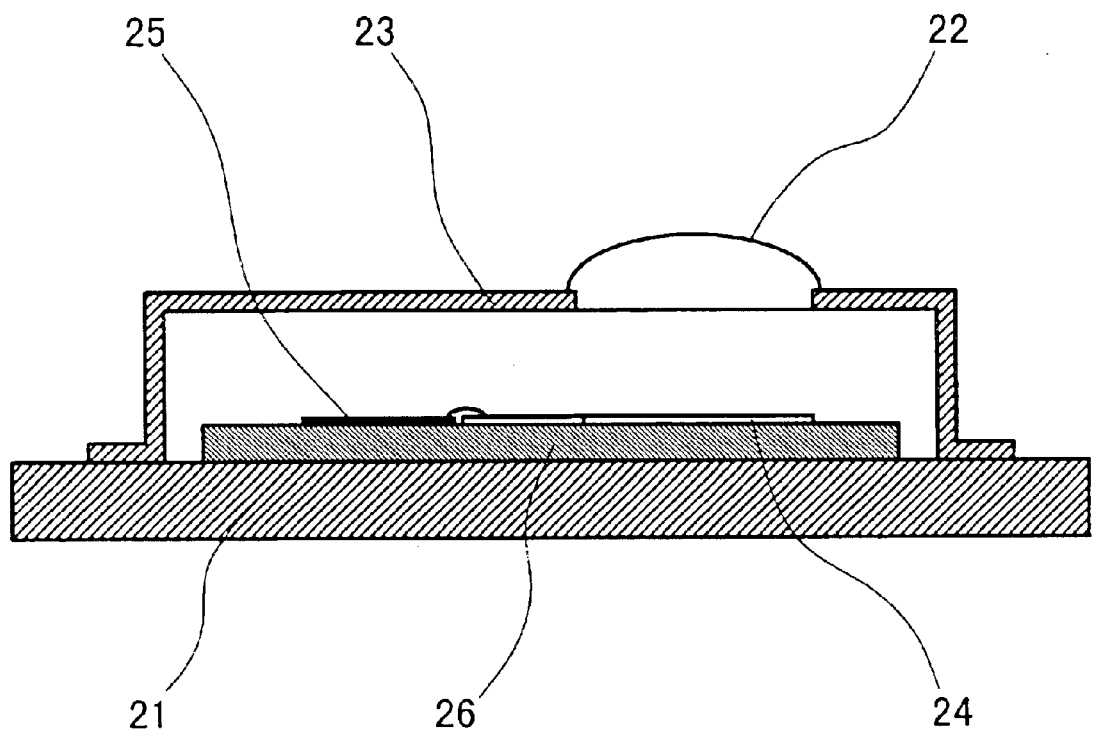
FIG. 5 is a sectional view of a conventional radar sensor.

FIG. 4 illustrates equivalent circuit diagrams of the chip 2 and chip 5 of the embodiment, in which FIG. 4(a) is a circuit block diagram of the transmission IC3, and FIG. 4(b) is a circuit block diagram of the reception IC4. In the transmission IC3, an amplifier 10 amplifies a high frequency signal generated by an oscillator 9, and then the transmission antenna 5 radiates the signal. The signal is reflected on an object, and the reception antenna 6 receives a reflection signal from the object. After a low noise amplifier 13 amplifies the reflection signal, a mixer 12 mixes the signal with a high frequency signal generated by a local oscillator 11 to generate an IF signal. In the IC3 and IC4, if a sufficient transmission power is obtained without the amplifier 10, the amplifier 10 may be omitted; in the same manner, if a sufficient reception sensitivity is obtained, the low noise amplifier 13 may be omitted.

In this embodiment, the IC3 and IC4 being an MMIC are sealed in the resin package 1, but the resin package 1 can integrally be formed with a metal mold; accordingly, the mounting cost can be reduced. Further, the dielectric lens and the resin package can integrally be formed with a metal mold, by using the same material to the dielectric lens and the resin package, and a low-cost large-scale production become possible.

The transmission antenna 5 is formed inside the transmission IC3, and the reception antenna 6 is formed inside the reception IC4; the high frequency signal does not flow across the bonding parts, and a special mounting technique is not needed.

In this embodiment, the resin package 1 and the dielectric lens 2 can reduce the cost by means of integral forming. In case of forming these separately, providing plural types of lenses optimized in regard to the frequency of the high frequency signal, the shape of the antenna, and the beam shape of the radiated electromagnetic wave, etc. will make it possible to comply with multiple kinds of applications, which is suitable for productions by small quantities and various kinds.

Figure 6:
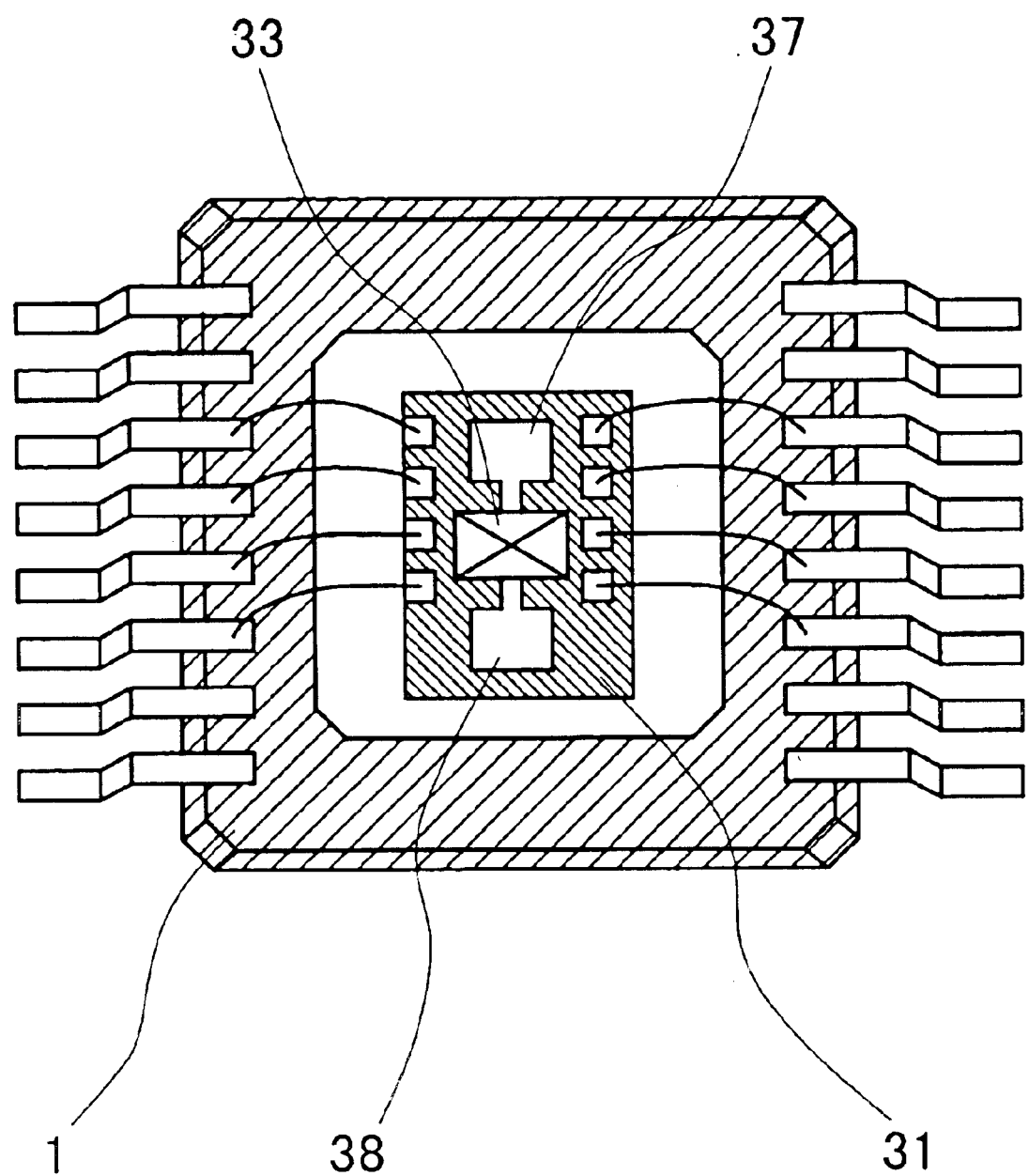
FIG. 6 is a plan view of the second embodiment of the radar sensor according to the invention.

FIG. 6 is a plan view of another embodiment of the radar sensor according to the invention. This embodiment implements the transmission IC and the reception IC with a one chip IC. In this embodiment, an active circuit assembly 33 including both the transmission circuit and the reception circuit, a transmission antenna 37, and a reception antenna 38 are formed on one semiconductor substrate 31, in which they are arranged so that the transmission antenna 37 and the reception antenna 38 are disposed to be symmetric with the active circuit assembly 33 put in the center thereof.

Figure 7:
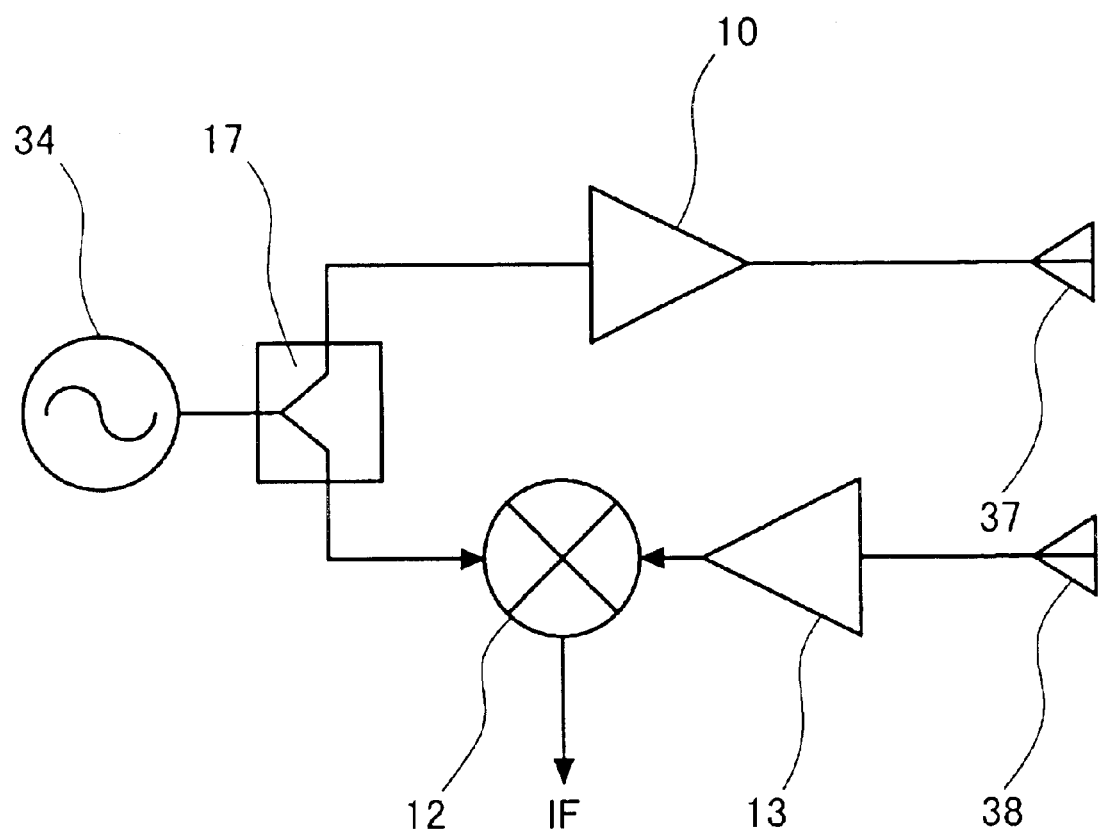
FIG. 7 is an equivalent circuit diagram of the second embodiment of the radar sensor according to the invention.
Figure 8:
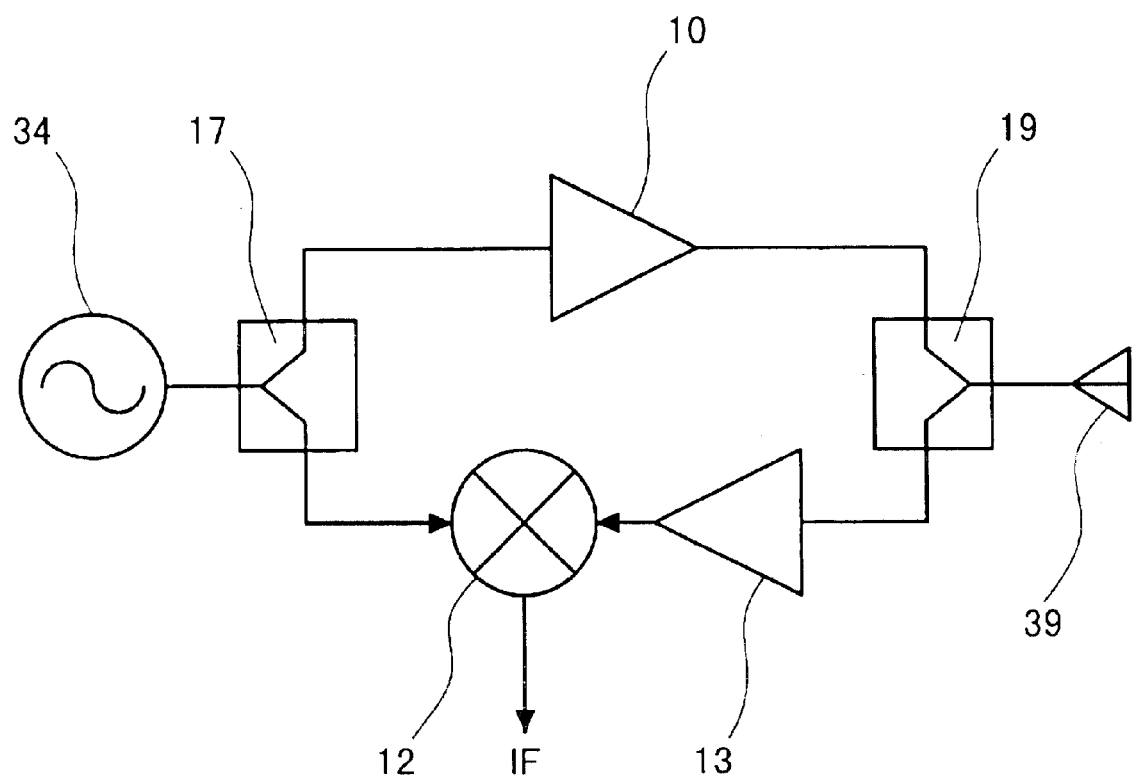
FIG. 8 is an equivalent circuit diagram of the third embodiment of the radar sensor according to the invention.

FIG. 7 is an equivalent circuit diagram of a circuit formed by the IC 31 for the radar sensor of another embodiment. In this embodiment, one and the same oscillator is used to an oscillator that generates a transmission signal, and also to a local oscillator that inputs a local signal to a mixer. A power distributor 17 distributes the high frequency signal generated by an oscillator 34, and one is used as the transmission signal and the other one is used as the local signal that is inputted to the mixer. The transmission signal is amplified by the amplifier 10, and then transmitted from the transmission antenna 37. Being received by the reception antenna 38, the reflection signal is amplified by the low noise amplifier 13, which is supplied to the mixer 12, where the IF signal is generated. In this embodiment, if a sufficient transmission power is obtained, the amplifier 10 maybe omitted; and if a sufficient reception sensitivity is obtained, the low noise amplifier 13 may be omitted. According to this embodiment, the IC for the radar sensor is composed of one chip MMIC 31, which further reduces the packaging cost. Further in this embodiment, using an antenna 39 that serves both the transmission and the reception, as illustrated in FIG. 8, and an isolator 19 allows the construction to be simplified.

Figure 9A:
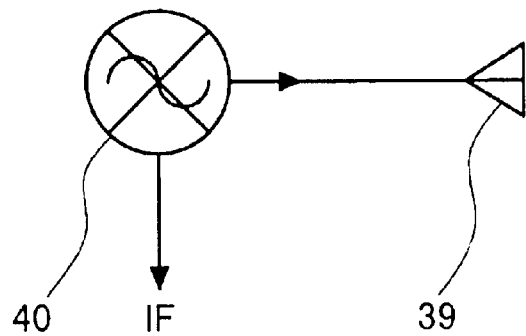
FIG. 9 is an equivalent circuit diagram of the fourth embodiment of the radar sensor according to the invention.
Figure 9B:
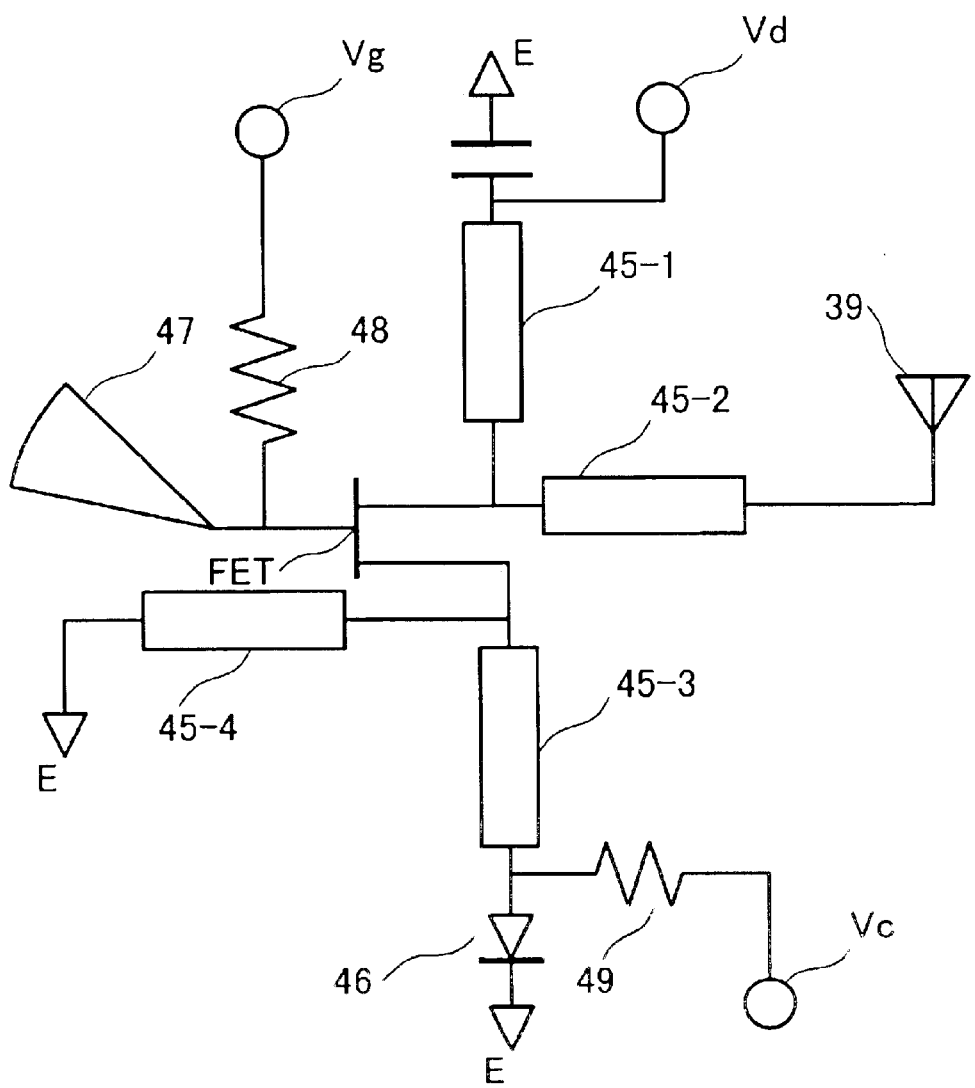

FIG. 9 illustrates a circuit construction of the MMIC 31 for the radar sensor of another embodiment according to the invention. As shown in FIG. 9(a) illustrating the equivalent circuit, this circuit can be simplified by using a self-oscillating mixer 40 and a combination transmission and reception antenna 39. In this circuit, as shown in FIG. 9(b), the drain terminal of a single FET is connected to one end of a distributed transmission line 45-2, and the other end of which is connected to the antenna 39. Also, the drain terminal of the FET is connected to one end of a distributed transmission line 45-1, and the other end of which is connected to a power supply terminal Vd. The power supply terminal Vd also serves as the intermediate frequency output terminal. The gate terminal of the FET has a resistor 48 connected, and it also has an impedance element 47 connected. The source terminal of the FET is connected to one end of an open stub resonator 45-3 connected, and the other end of which is connected to a varactor diode 46 for frequency adjustment, where a control voltage terminal Vc is connected through a resistor 49. The source terminal of the FET is grounded through a ¼λ distributed transmission line 45-4. In the drawing, the symbol E signifies the ground, which is connected to the grounding terminal of the MMIC substrate.

Figure 10:
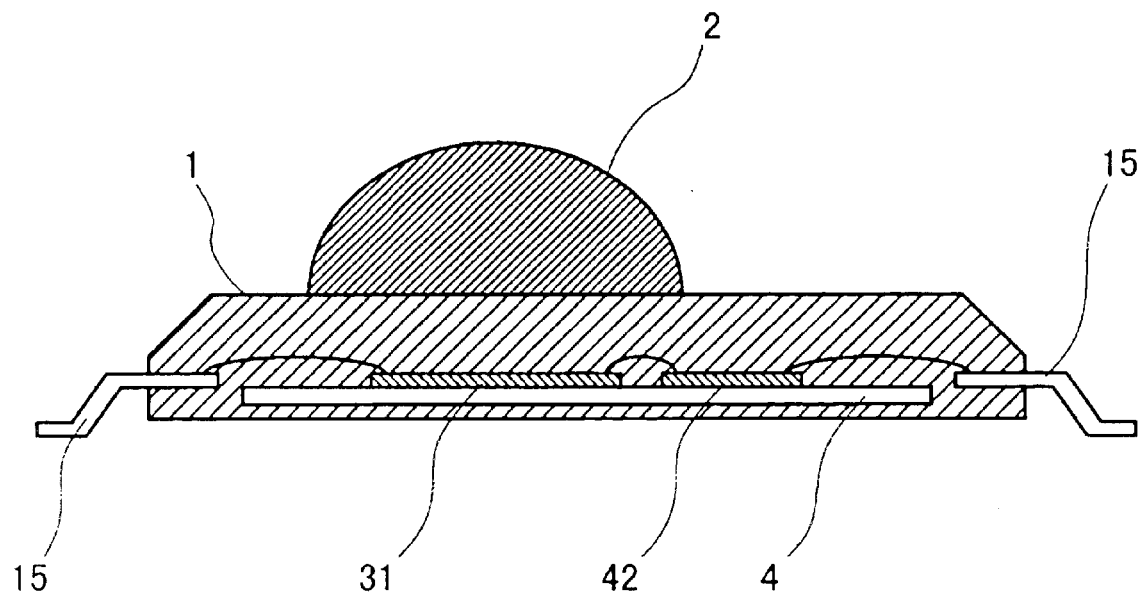
FIG. 10 is a side sectional view of the fifth embodiment of the radar sensor according to the invention.

FIG. 10 illustrates a side section of another embodiment of the radar sensor according to the invention. This embodiment mounts a radar sensor IC31 and a signal processing IC 42 inside the resin package 1. The signal processing IC 42 is to execute the Fourier Transform of the IF signal that the radar sensor generates.

According to this embodiment, the signal processing IC 42 executes the signal processing of the signal that the radar sensor IC31 outputs, whereby a more high-grade radar sensor can be realized.

Figure 11:
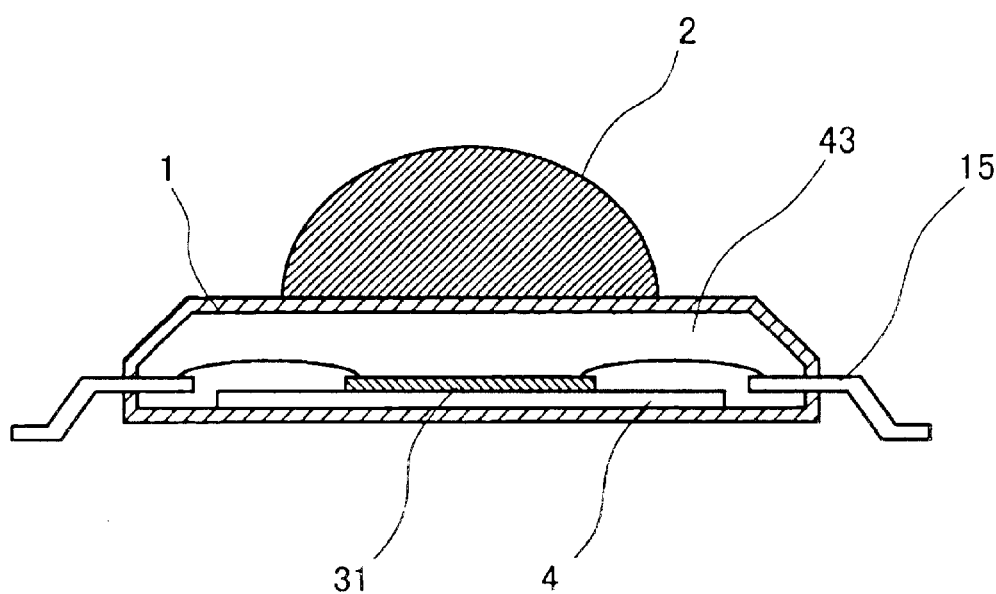
FIG. 11 is a side sectional view of the sixth embodiment of the radar sensor according to the invention.

FIG. 11 illustrates a side section of another embodiment of the radar sensor according to the invention. The aforementioned embodiments have presented examples that fill the package with the same resin; however, a part of the package may be filled with a different resin. In this embodiment in FIG. 11, another resin 43 is used to the area that adjoins the MMIC 31. Especially, the high frequency characteristics of the material that adjoins the MMIC gives a great influence to the performance of the radar sensor; accordingly, using a material of a low dielectric loss with excellent high frequency characteristics to this area will realize a higher performance radar sensor. Further, if it is desired to completely remove the influence of resin, this area may be filled with air or vacuum, or nitrogen, instead of resin.

Figure 12:
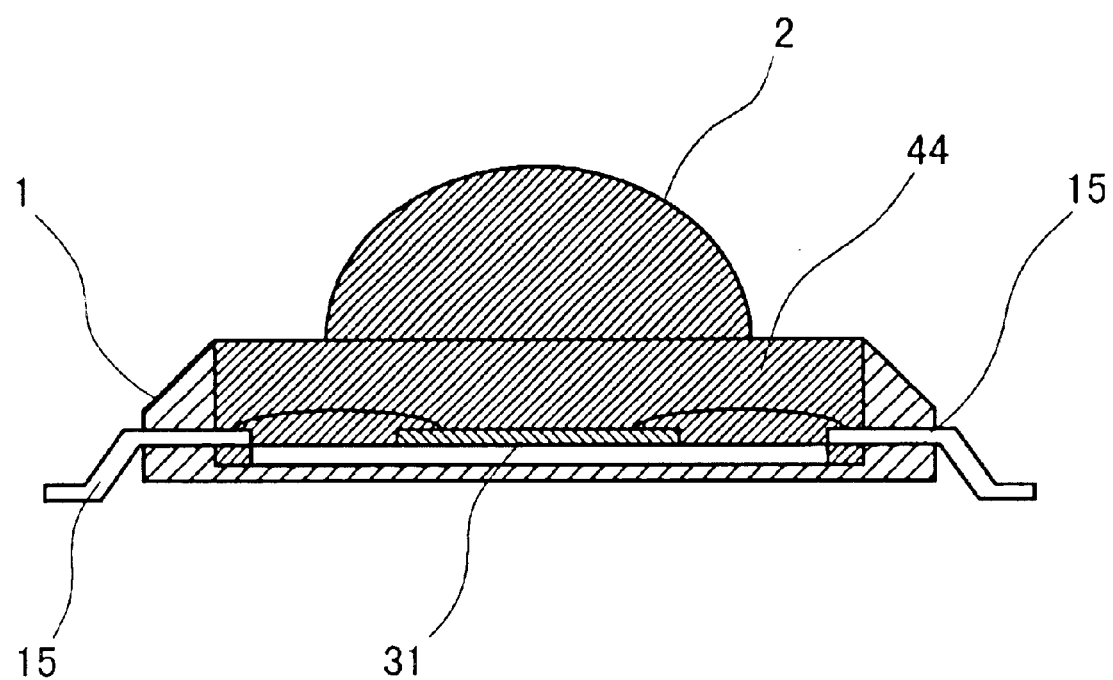
FIG. 12 is a side sectional view of the seventh embodiment of the radar sensor according to the invention.

As shown in FIG. 12, if a same material is used to a resin 44 and the dielectric lens 2 being a part inside the package 1, the production cost will be reduced. As mentioned in these embodiments, using another resin to a part of the package permits to produce a higher performance radar sensor. It is especially effective to use an excellent material in terms of the high frequency characteristics to an area that adjoins the MMIC, an area over the antenna, and an area through which the high frequency signal passes.

As the embodiments thus described, according to the invention, in the radar sensor that uses a super high frequency signal such as a millimeter wave or a sub-millimeter wave, it is possible to produce a low cost radar sensor, by sealing a radar sensor MMIC with a resin package and combining this package with a dielectric lens.

Further, it becomes possible to mass-produce a radar sensor at a low cost, by integrally forming this dielectric lens and the resin package.

What is claimed is:

1. A radar sensor comprising:
   a transmission circuit to transmit a transmission signal;
   a reception circuit to receive a reflection signal based on the transmission signal;
   a transmission antenna electrically coupled to the transmission circuit to radiate the transmission signal generated in the transmission circuit;
   a reception antenna electrically coupled to the reception circuit to receive the reflection signal and provide the reception circuit with the reflection signal; and
   a resin package that monolithically seals the transmission circuit, the reception circuit, the transmission antenna, and the reception antenna,
   wherein the transmission circuit, the reception circuit, the transmission antenna, and the reception antenna are monolithically formed on a single microwave monolithic integrated circuit chip.

2. The radar sensor according to claim 1,
   wherein a dielectric lens is formed on the resin package so as to cover the transmission antenna and the reception antenna.

3. The radar sensor according to claim 2,
   wherein the dielectric lens is formed integrally with the resin package by using the same materials as that of the resin package.

4. The radar sensor according to claim 3,
   wherein the transmission antenna and the reception antenna are arranged so as to be disposed symmetrically with an assembly of the transmission circuit and the reception circuit.

5. The radar sensor according to claim 3,
   wherein a frequency of the transmission signal is operational in a frequency range from 20 GHz to 100 Hz.

6. The radar sensor according to claim 3,
   wherein the microwave monolithic integrated circuit chip further includes a signal processing circuit that processes an output from at least one of the transmission circuit and the reception circuit.

7. The radar sensor according to claim 3,
   wherein a material for the dielectric lens has a relative permittivity ranging from 3 to 6.

8. The radar sensor according to claim 2,
   wherein the dielectric lens and the resin package are separately formed, and the dielectric lens is adhered onto the resin package.

9. The radar sensor according to claim 2,
   wherein the transmission antenna and the reception antenna are arranged so as to be disposed symmetrically with an assembly of the transmission circuit and the reception circuit.

10. The radar sensor according to claim 2,
    wherein a frequency of the transmission signal is operational in a frequency range from 20 GHz to 100 GHz.

11. The radar sensor according to claim 2,
    wherein the microwave monolithic integrated circuit chip further includes a signal processing circuit that processes an output from at least one of the transmission circuit and the reception circuit.

12. The radar sensor according to claim 2,
    wherein a material for the dielectric lens has a relative permittivity ranging from 3 to 6.

13. The radar sensor according to claim 1,
    wherein the transmission antenna and the reception antenna are arranged so as to be disposed symmetrically with an assembly of the transmission circuit and the reception circuit.

14. The radar sensor according to claim 1,
    wherein a frequency of the transmission signal is operational in a frequency range from 20 GHz to 100 GHz.

15. The radar sensor according to claim 1,
    wherein the microwave monolithic integrated circuit chip further includes a signal processing circuit that processes an output from at least one of the transmission circuit and the reception circuit.

16. A radar sensor comprising:

an active circuit assembly to transmit a transmission signal and receive a reflection signal based on the transmission signal;

a transmission antenna electrically coupled to the active circuit assembly to radiate the transmission signal generated in the active circuit assembly;

a reception antenna electrically coupled to the active circuit assembly to receive the reflection signal and provide the active circuit assembly with the reflection signal; and a resin package that monolithically seals the active circuit assembly, the transmission antenna, and the reception antenna, wherein the active circuit assembly, the transmission antenna, and the reception antenna are monolithically formed on a single microwave monolithic integrated circuit chip.

17. The radar sensor according to claim 16, wherein a dielectric lens is formed on the resin package so as to cover the transmission antenna and the reception antenna.

18. The radar sensor according to claim 16, wherein the transmission antenna and the reception antenna are arranged so as to be disposed symmetrically with the active circuit assembly.

19. The radar sensor according to claim 16, wherein a frequency of the transmission signal is operational in a frequency range from 20 GHz to 100 GHz.

20. The radar sensor according to claim 16, wherein the microwave monolithic integrated circuit chip further includes a signal processing circuit that processes an output from the active circuit assembly.

\* \* \* \* \*